United States Patent
Miyata et al.

(10) Patent No.: US 7,888,399 B2
(45) Date of Patent: Feb. 15, 2011

(54) CURABLE COMPOSITION CONTAINING THIOL COMPOUND

(75) Inventors: Hideo Miyata, Kawasaki (JP); Katsuro Urakawa, Kawasaki (JP); Haruhiko Ikeda, Kawasaki (JP); Yotaro Hattori, Kawasaki (JP)

(73) Assignee: Showa Denko K.K., Tokyo (JP)

( * ) Notice: Subject to any disclaimer, the term of this patent is extended or adjusted under 35 U.S.C. 154(b) by 0 days.

(21) Appl. No.: 12/162,081

(22) PCT Filed: Jan. 25, 2007

(86) PCT No.: PCT/JP2007/051168
§ 371 (c)(1),
(2), (4) Date: Jul. 24, 2008

(87) PCT Pub. No.: WO2007/086461
PCT Pub. Date: Aug. 2, 2007

(65) Prior Publication Data
US 2009/0023831 A1     Jan. 22, 2009

(30) Foreign Application Priority Data
Jan. 26, 2006   (JP)   ............................... 2006-017788

(51) Int. Cl.
C08G 18/67   (2006.01)
C08G 61/12   (2006.01)
C08G 18/32   (2006.01)
C08G 18/71   (2006.01)

(52) U.S. Cl. ........................... 522/97; 522/90; 522/167; 522/174; 528/66; 528/69

(58) Field of Classification Search .................. 522/90, 522/97, 167, 174, 178, 180; 528/69, 66, 528/65, 85
See application file for complete search history.

(56) References Cited

U.S. PATENT DOCUMENTS

| | | | | |
|---|---|---|---|---|
| 4,020,233 A | * | 4/1977 | Morgan | 428/419 |
| 4,785,064 A | * | 11/1988 | Hegel | 526/261 |
| 5,236,967 A | * | 8/1993 | Ohkawa et al. | 522/32 |
| 5,451,695 A | * | 9/1995 | Kawasaki et al. | 560/33 |
| 6,551,710 B1 | * | 4/2003 | Chen et al. | 428/412 |
| 7,341,828 B2 | * | 3/2008 | Katoh et al. | 430/270.11 |

FOREIGN PATENT DOCUMENTS

| | | | |
|---|---|---|---|
| JP | 04-266927 A | | 9/1992 |
| JP | 05-093070 A | | 4/1993 |
| JP | 10-332901 A | | 12/1998 |
| JP | 11-021352 A | | 1/1999 |
| JP | 2000-206301 A | | 7/2000 |
| JP | 2001-026608 A | | 1/2001 |
| JP | 2003-226718 A | | 8/2003 |
| JP | 2003-277505 A | | 10/2003 |
| JP | 2004-149755 A | | 5/2004 |
| JP | 2004-264435 A | | 9/2004 |
| JP | 2005-195977 A | | 7/2005 |
| JP | 2005-308813 A | | 11/2005 |
| JP | 2006282657 | * | 10/2006 |
| WO | 03/072614 A2 | | 9/2003 |
| WO | WO 2006049264 A1 | * | 5/2006 |

* cited by examiner

*Primary Examiner*—Mark Eashoo
*Assistant Examiner*—Jessica Paul
(74) *Attorney, Agent, or Firm*—Sughrue Mion, PLLC

(57) ABSTRACT

The present invention relates to a curable composition having high adhesiveness and transparency, comprising a thiol compound containing two or more groups represented by formula (1):

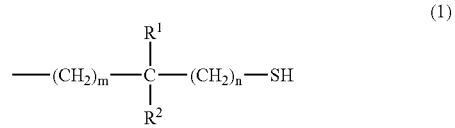

wherein the symbols in the formula have the meanings as described in the specification; and
an urethane compound containing an ethylenically unsaturated double bond represented by formula (2):

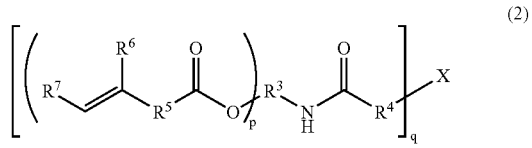

wherein the symbols in the formula have the meanings as described in the specification.

17 Claims, No Drawings

CURABLE COMPOSITION CONTAINING THIOL COMPOUND

TECHNICAL FIELD

The present invention relates to a curable composition used for coating materials, UV-curable and thermosetting coatings, molding materials, adhesive agent, ink, optical materials, stereo lithography materials, printing plate materials, light-sensitive film materials and the like, particularly to a curable composition suitable for optical materials. More specifically, the present invention relates to a curable composition containing a specific thiol compound and a urethane compound containing an ethylenically unsaturated double bond as components, which is characterized in being photocurable and excellent in stability.

BACKGROUND ART

Recently, a composition being curable through the irradiation of an active ray such as ultraviolet has been used in a broad range of fields such as coating materials, UV-curable and thermosetting coatings, molding materials, adhesive agent, ink, light-sensitive films, optical materials, stereo lithography materials, printing plate materials, dental materials, polymer battery materials and polymer materials. For example, as optical materials, the composition has been used for optical lenses, coating materials such as a film, clad materials for optical fibers, optical fibers and optical adhesives for optical lenses and the like.

The higher the requirements for high performance of the above-mentioned optical materials and electronic materials for use in each field, the higher the requirements for each performance of the curable composition in terms of reactive property, curing property, optical property of the cured product such as transmittance and refractive index, adhesiveness to a substrate, heat resistance, etc.

A curable composition comprising a thiol compound is known as one of these light-curable compositions.

Such curable compositions are one-component or two-component light-curable compositions, and cured within a period of a few seconds to a few minutes through radical polymerization of a compound containing a polyethylenically unsaturated double bond and a thiol compound by light irradiation. While these conventional polyene/polythiol-based light-curable compositions are excellent in workability and curability, they have low stability and become increasingly viscous and tend to cause gelation when they are kept in a liquid state before use. And the light-cured products produced by a composition kept in such a state have a problem of low heat resistance.

The invention of JP-A-2003-226718 (Patent Document 1) relates to a light-curable composition containing a specific polythiol, at least one polyene compound and a radical photopolymerization initiator. The curable composition is characterized in being capable of obtaining a cured product having high refraction index and high hardness by containing sulfur atoms in the composition.

The invention of JP-A-2003-277505 (Patent Document 2) relates to a light curable resin composition containing a compound having a bromine-substituted aromatic ring as well as polyene and polythiol, which enables to obtain high refraction index.

In JP-A-2003-226718 and JP-A-2003-277505 mentioned above, a curable composition which enables to obtain a cured product having high refraction index but has unresolved issues in terms of stability, reactive property, cure shrinkage factor and adhesiveness is obtained by containing sulfur atoms.

JP-A-2001-26608 (Patent Document 3) discloses a light-curable resin composition containing polyene, a photopolymerization initiator, and metal ions of 50 ppm or less. The composition is characterized in obtaining storage stability of the light-curable resin composition by reducing the amount of the metal ion.

JP-A-2004-149755 (Patent Document 4; WO 03/72614) discloses a photopolymerization initiator composition comprising a thiol compound containing a mercapto group having a specific substituent and a photopolymerization initiator. The invention is characterized in obtaining a photosensitive composition having high sensitivity and excellent storage stability.

However, while the invention of JP-A-2001-26608 and JP-A-2004-149755 enables to improve stability and refraction index of the composition, it still has unresolved issues in terms of adhesiveness, cure shrinkage factor, heat resistance and optical property which are required for the use as coating materials, adhesive agent and other electronics materials.

Additionally, JP-A-2004-264435 (Patent Document 5), JP-A-2005-195977 (Patent Document 6) and JP-A-2005-308813 (Patent Document 7) respectively discloses:
  a photosensitive composition for color filters comprising a compound having an ethylenically unsaturated double bond, a photopolymerization initiator, a pigment and a specific thiol compound;
  a curable resin composition for liquid crystal display elements comprising episulfide resin and a hardener; and
  a curable resin composition for liquid crystal display elements comprising curable resin and a hardener.

[Patent Document 1] JP-A-2003-226718
[Patent Document 2] JP-A-2003-277505
[Patent Document 3] JP-A-2001-26608
[Patent Document 4] JP-A-2004-149755
[Patent Document 5] JP-A-2004-264435
[Patent Document 6] JP-A-2005-195977
[Patent Document 7] JP-A-2005-308813

DISCLOSURE OF THE INVENTION

Problems to be Solved by the Invention

Consequently, the present invention aims to provide a curable composition which has high adhesiveness to a substrate, high reactive property and high transparency in order to solve the above-mentioned problems.

Means to Solve a Problem

As a result of intensive study to solve the above problems, the present inventors have found that a cured product being excellent in adhesiveness, reactive property and transparency can be obtained by combining a particular polyfunctional thiol compound and a particular urethane compound having an ethylenically unsaturated double bond, and that heat resistance and hardness can be improved by restricting the urethane equivalent within an optimum range, and thereby have solved the above problems. Furthermore, when a thiol compound having at least two secondary and above mercapto groups as a specific polyfunctional thiol compound, it also enables to improve stability.

More specifically, the curable composition of the present composition is a curable composition comprising a sterically-hindered thiol compound which contains two or more mercapto groups having a substituent at a carbon atom placed at the alpha and/or beta position to the mercapto group and an urethane compound containing an ethylenically unsaturated double bond, which is characterized in being curable by light irradiation.

The present invention relates to the following matters:

1. A curable composition comprising a thiol compound containing two or more groups represented by formula (1):

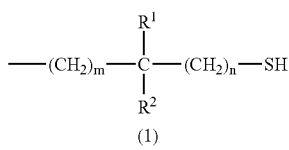

(1)

wherein $R^1$ and $R^2$ independently represent a hydrogen atom, an alkyl group having 1 to 10 carbon atoms or an aromatic ring; m represents 0 or an integer of 1 to 2; n represents 0 or 1; and an urethane compound containing an ethylenically unsaturated double bond represented by formula (2):

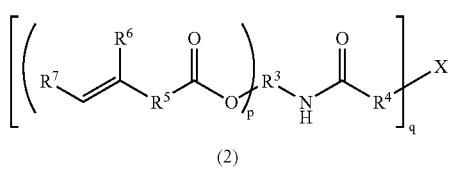

(2)

wherein $R^3$ represents a linear or branched alkylene group having 1 to 10 carbon atoms or an aromatic ring; $R^4$ represents an oxygen atom, a sulfur atom or an imino group; $R^5$ represents a single bond or a linear or branched alkylene group having 1 to 5 carbon atoms; $R^6$ represents a hydrogen atom or a methyl group; $R^7$ represents a hydrogen atom or at least one group selected from a group of linear or branched alkyl group having 1 to 6 carbon atoms and aryl group; X represents a group selected from an aliphatic group, an aromatic group and a heterocyclic ring; p represents an integer of 1 to 3; and q represents an integer of 1 to 4.

2. The curable composition as described in 1 above, wherein the urethane equivalent of the urethane compound having an ethylenically unsaturated double bond represented by formula (2) is 10 to 40%.

3. The curable composition as described in 1 above, wherein the thiol compound is an ester compound of a mercapto group-containing carboxylic acid represented by formula (3):

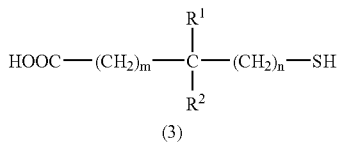

(3)

wherein the symbols in the formula have the same meanings as described in 1 above; and polyfunctional alcohol.

4. The curable composition as described in 1 or 2 above, wherein at least one of $R^1$ and $R^2$ of the thiol compound described in 1 above represents an alkyl group having 1 to 10 carbon atoms and the other represents a hydrogen atom.

5. The curable composition as described in 3 above, wherein the polyfunctional alcohol is a compound selected from alkylene glycol comprising an alkylene group having 2 to 10 carbon atoms which may be branched, diethylene glycol, dipropylene glycol, glycerin, trymethylol propane, pentaerythritol, dipentaerythritol, cyclohexane diol, cyclohexane dimethanol, norbornene dimethanol, 2,2-bis[4-(2-hydroxyethyloxy)phenyl]propane, hydrogenated bisphenol A, 4,4'-(9-fluolenylidene) bis(2-phenoxyethanol) and tris-2-hydroxyethyl isocianurate.

6. The curable composition as described in 3 above, wherein the thiol compound is a compound represented by formula (4):

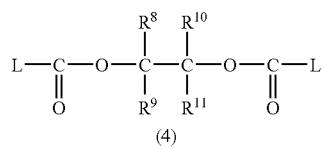

(4)

wherein $R^8$ to $R^{11}$ independently represent a hydrogen atom or an alkyl group having 1 to 10 carbon atoms; and L represents a group represented by formula (1) described in 1 above.

7. The curable composition as described in 3 above, wherein the thiol compound is a compound represented by formula (5):

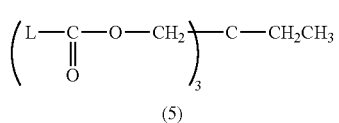

(5)

wherein L represents a group represented by formula (1) described in 1 above.

8. The curable composition as described in 3 above, wherein the thiol compound is a compound represented by formula (6).

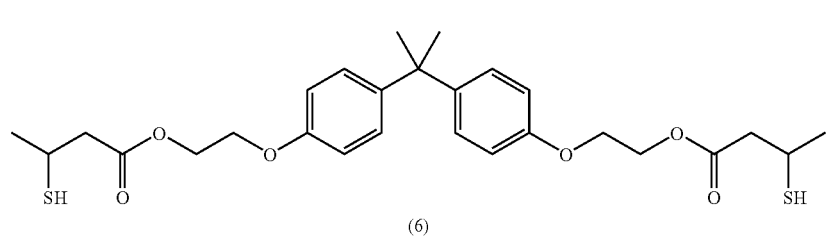

(6)

9. The curable composition as described in 3 above, wherein the thiol compound is a compound represented by formula (7).

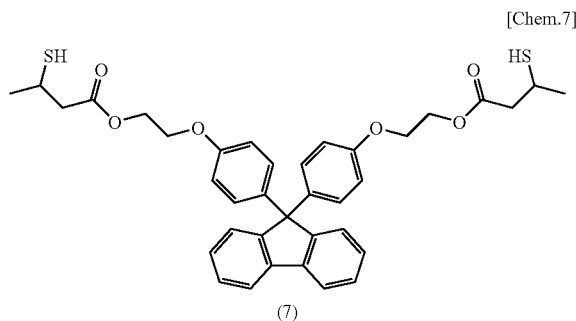

(7)

10. The curable composition as described in 3 above, wherein the thiol compound is a compound represented by formula (8).

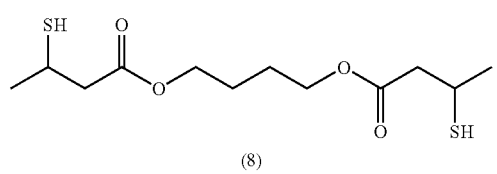

(8)

11. The curable composition as described in 3 above, wherein the thiol compound is a compound represented by formula (9).

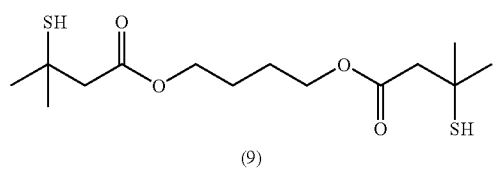

(9)

12. The curable composition as described in 3 above, wherein the thiol compound is a compound represented by formula (10).

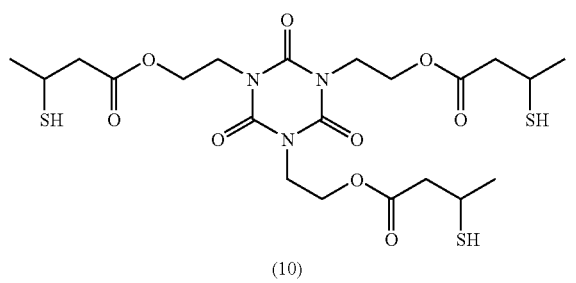

(10)

13. The curable composition as described in 3 above, wherein the thiol compound is a compound represented by formula (11).

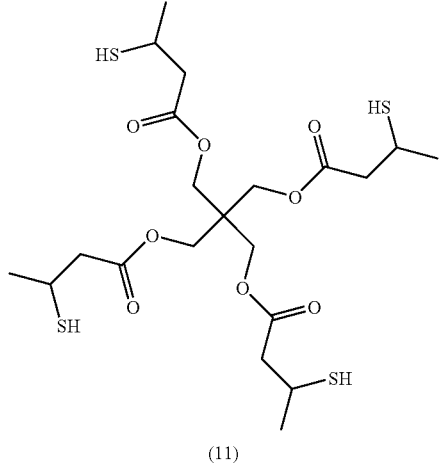

(11)

14. The curable composition as described in 1 or 2 above, wherein the urethane compound having an ethylenically unsaturated double bond is a compound represented by formula (12):

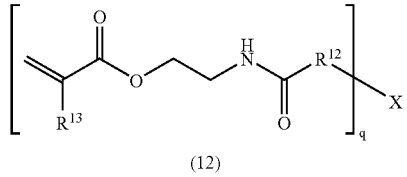

(12)

wherein $R^{12}$ represents an oxygen atom, a sulfur atom or an imino group; $R^{13}$ represents a hydrogen atom or a methyl group; X represents a group selected from an aliphatic group, an aromatic group and a heterocyclic group; and q represents an integer of 1 to 4.

15. The curable composition as described in 1 or 2 above, wherein the urethane compound having an ethylenically unsaturated double bond is a compound represented by formula (13):

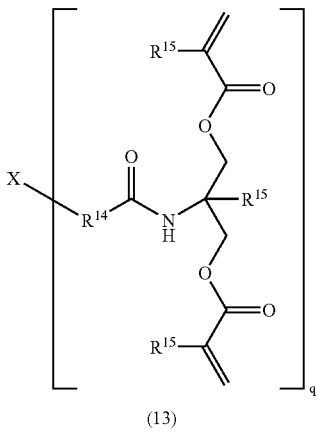

(13)

wherein $R^{14}$ represents an oxygen atom, a sulfur atom or an imino group; $R^{15}$ represents a hydrogen atom or a methyl group; X represents a group selected from an aliphatic group, an aromatic group and a heterocyclic group; and q represents an integer of 1 to 4.

16. The curable composition as described in 1 or 2 above, wherein the urethane compound having an ethylenically unsaturated double bond is a compound represented by formula (14):

[Chem. 14]

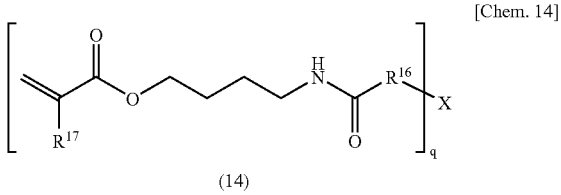

(14)

wherein $R^{16}$ represents an oxygen atom, a sulfur atom or an imino group; $R^{17}$ represents a hydrogen atom or a methyl group; X represents a group selected from an aliphatic group, an aromatic group and a heterocyclic group; and q represents an integer of 1 to 4.

17. The curable composition as described in 1 or 2 above, wherein the urethane compound having an ethylenically unsaturated double bond is a compound represented by formula (15):

[Chem. 15]

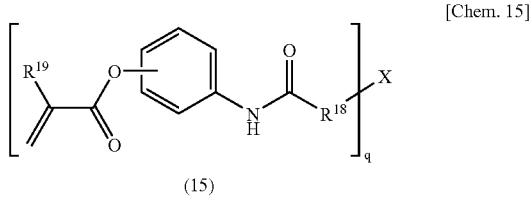

(15)

wherein $R^{18}$ represents an oxygen atom, a sulfur atom or an imino group; $R^{19}$ represents a hydrogen atom or a methyl group; X represents a group selected from an aliphatic group, an aromatic group and a heterocyclic group; and q represents an integer of 1 to 4.

18. The curable composition as described in any one of 1 to 17 above, comprising a photopolymerization initiator as well as a thiol compound and an urethane compound having an ethylenically unsaturated double bond.

19. A cured product obtained from the composition described in any one of 1 to 18 above.

Thus, the present invention is characterized in attaining good adhesiveness to a substrate and good transparency by using a specific polyfunctional thiol compound and a specific urethane compound having an ethylenically unsaturated double bond in a curable composition.

It is presumed to be attributed to the phenomenon that a heat addition reaction of the thiol compound with the ethylenically unsaturated double bond contained in the urethane compound used in the present invention takes place concurrently with the radical chain reaction at the time of light curing. That is, hydrogen abstraction by a mercapto radical quickly proceeds in radical propagating reaction in case of a thiol compound used in conventional technology. In contrast, the hydrogen abstraction becomes slower due to steric hindrance with respect to the thiol compound used in the present invention and the addition reaction of the mercapto group to the ethylenically unsaturated double bond, which is a competing reaction, is assumed to be inversely accelerated. Moreover, it is easily anticipated that the tendency increases with an increase in temperature.

Furthermore, the urethane compound containing an ethylenically unsaturated double bond used in the present invention is particularly increased in reactivity compared to an ethylenically unsaturated double bond-containing compound without comprising a urethane bond. It is presumed to be attributed to the phenomenon that the hydrogen atom of a urethane bond is abstracted and participates in the reaction.

The curable composition of the present invention is suitable for use in molding materials, light-sensitive films (solder resist, etching resist, color filter resist, spacer, etc.), sealant such as waterproof sealant, coatings (UV-curable and thermosetting coatings, antifouling coatings, fluorinated coatings, waterborne coatings, etc.), adhesives (adhesive agent, dicing tapes, etc.), printing plate materials (CTP plate, offset plate, etc.), print proof such as color proof, lenses (contact lenses, micro lenses, optical waveguide lenses, etc.), dental materials, coating materials (optical fiber coatings, disc coatings, etc.), battery materials such as solid electrolyte, etc.

Owing to properties such as obtainable cure reactivity, reduced cure shrinkage factor, adhesiveness to a substrate and transparency, the curable composition of the present invention is particularly suitable for optical materials, coating materials, light-sensitive films, UV-setting coatings and the like. However, the usage of the curable composition is not limited thereto.

The embodiments of the present invention are described in details hereinafter.

Thiol Compound

The thiol compound used in the present invention is a specific thiol compound containing two or more groups represented by formula (1):

[Chem. 16]

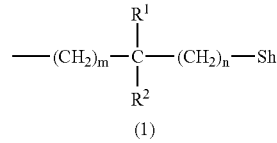

(1)

In the above formula (1), $R^1$ and $R^2$ independently represent a hydrogen atom, an alkyl group having 1 to 10 carbon atoms or an aromatic ring. That is, both of $R^1$ and $R^2$ may be a hydrogen atom. In the case that both of $R^1$ and $R^2$ are an alkyl group, they may be the same or different. Particularly preferable is the case where at least one of $R^1$ and $R^2$ represents an alkyl group having 1 to 10 carbon atoms and the other represents a hydrogen atom. The alkyl group having 1 to 10 carbon atoms represented by $R^1$ and $R^2$ may either be linear or branched. Examples of the alkyl group include methyl group, ethyl group, n-propyl group, iso-propyl group, n-butyl group, iso-butyl group, tert-butyl group, n-hexyl group and n-octyl group. Among these, particularly preferred is methyl group or ethyl group. Examples of the aromatic ring represented by $R^1$ and $R^2$ include phenyl group, tolyl group and naphthyl group, and phenyl group is particularly preferable. m represents 0 or an integer of 1 to 2, preferably 0 or 1. n represents 0 or 1, preferably 0.

Thus, the thiol compound used in the present invention is a polyfunctional thiol compound having two or more mercapto groups. It is well known that using a polyfunctional compound enables to attain higher crosslinking density compared to when a monofunctional compound is used.

Examples of such a polyfunctional thiol compound include a compound wherein the mercapto group comprising-group represented by the above formula (1) contains (a) a hydrocarbon structure, (b) an ester structure represented the following formula (16):

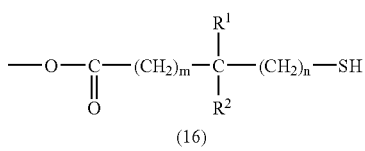

(16)

wherein $R^1$ and $R^2$ independently represents a hydrogen atom or an alkyl group having 1 to 10 carbon atoms; m represents 0 or an integer of 1 to 2; and n is 0 or 1; or (c) an ester structure represented by formula (17):

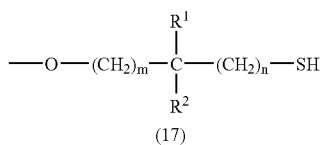

(17)

wherein $R^1$ and $R^2$ independently represents a hydrogen atom or an alkyl group having 1 to 10 carbon atoms; m represents an integer of 0 or 1 to 2; and n is 0 or 1. Among these, a compound containing group (b) or (c) is preferable. From the viewpoint of storage stability, it is preferable to use a secondary or tertiary thiol compound.

Examples of a thiol compound containing a hydrocarbon structure (a) include 2,5-hexanedithiol, 2,9-decanedithiol and 1,4-bis(1-mercaptoethyl)benzene.

Examples of a thiol compound containing an ester structure (b) includes a compound which can be synthesized by esterifying alcohol and carboxylic acid containing the mercapto group represented by formula (3):

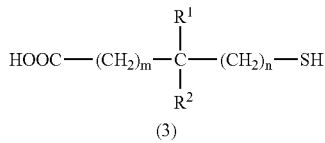

(3)

wherein the symbols in the formula have the same meanings as mentioned above. In this case, a polyfunctional alcohol is used for the alcohol so as to make the compound after the esterification reaction a polyfunctional thiol compound.

Specific examples of the carboxylic acid containing the mercapto group represented by formula (3) include 2-mercaptopropionic acid, 3-mercaptobutyric acid, 2-mercaptoisobutyric acid, 2-mercaptoisobutyric acid, 3-mercaptopropionic acid, 3-mercapto-3-phenylpropionic acid and 3-mercapto-3-methylbutyric acid.

Specific examples of the polyfunctional alcohol include alkylene glycol (an alkylene group having 2 to 10 carbon atoms is preferable, the carbon chain of which may be branched). Examples include ethylene glycol, trimethylene glycol, 1,2-propylene glycol, 1,2-butane diol, 1,3-butane diol, 2,3-butane diol, tetramethylene glycol, 1,5-pentadiol and 1,6-hexanediol.), diethylene glycol, glycerin, dipropylene glycol, trimethylol propane, pentaerythritol, dipentaerythritol, cyclohexane diol, cyclohexane dimethanol, norbornene dimethanol, norbornane dimethanol, polycarbonate diol, di-terminated hydroxy polysilicon, polyol containing an aromatic ring, tris-2-hydroxyethyl isocyanurate, 2,2-bis[4-(2-hydroxyethyloxy)phenyl]propane, hydrogenated bisphenol A and 4,4'-(9-fluolenylidene)bis(2-phenoxyethanol).

Among these, particularly preferable polyfunctional alcohols include alkylene glycol having 2 carbon atoms and an alkylene main chain such as ethylene glycol, 1,2-propylene glycol and 1,2-butane diol; trimethylol propane; polycarbonate diol; cyclohexane diol; cyclohexane dimethanol and 1,5-pentanediol. Examples of the polyol containing an aromatic ring include 2,2-bis[4-(2-hydroxyethyloxy)phenyl]propane, 4,4'-(9-fluolenylidene)diphenol and 4,4'-(9-fluolenylidene)bis(2-phenoxyethanol).

As a specific example of the polyfunctional thiol compound obtained by esterifying these polyfunctional alcohols, preferred are a polyfunctional thiol compound represented by formula (4):

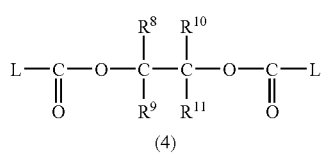

(4)

wherein $R^8$ to $R^{11}$ independently represent a hydrogen atom or an alkyl group having 1 to 10 carbon atoms and L represents a group represented by the above-mentioned formula (1) and a polyfunctional thiol compound represented by formula (5)

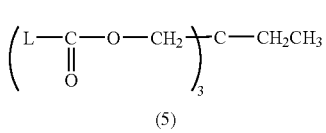

(5)

wherein L has the same meaning as previously described.

In formula (4), $R^8$ to $R^{11}$ independently represent a hydrogen atom or an alkyl group having 1 to 10 carbon atoms. As an alkyl group, the linear or branched alkyl group having 1 to 3 carbon atoms is preferable. Specific examples include methyl group, ethyl group, n-propyl group and iso-propyl group, and among these, methyl group and ethyl group are preferable. Most preferably, $R^8$ represents a hydrogen atom, methyl group or ethyl group, and all of $R^9$ to $R^{11}$ represent a hydrogen atom. L represents a group containing the mercapto group represented by the above formula (1).

Formula (4) represents a compound having two groups containing a mercapto group, which uses diol having an alkylene main chain and 2 carbon atoms as polyfunctional alcohol. Formula (5) represents a compound having three groups containing a mercapto group, which uses trimethylol propane as polyfunctional alcohol.

Specific examples of these compounds include phthalic acid di(1-mercaptoethylester), phtalic acid di(2-mercaptopropylester), phthalic acid di(3-mercaptobutylester) and phthalic acid di(3-mercaptoisobutylester).

Among these, preferred are ethylene glycol bis(3-mercaptobutyrate), propylene glycol bis(3-mercaptobutyrate), diethylene glycol bis(3-mercaptobutyrate), butane diol bis(3-mercaptobutyrate), octane diol bis(3-mercaptobutyrate), trimethylol propane tris(3-mercaptobutyrate), pentaerythritol tetrakis(3-mercaptobutyrate), dipentaerythritol hexakis(3-mercaptobutyrate), ethylene glycol bis(2-mercaptopropionate), propylene glycol bis(2-mercaptopropionate), diethylene glycol bis(2-mercaptopropionate), butane diol bis(2-mercaptopropionate), octane diol bis(2-mercaptopropionate), trimethylol propane tris(2-mercaptopropionate), pentaerythritol tetrakis(2- mercaptopropionate), dipentaerythritol hexakis(2-mercaptopropionate), ethylene glycol bis(3-mercaptoisobutyrate), propylene glycol bis(3-mercaptoisobutyrate), diethylene glycol bis(3-mercaptoisobutyrate), butane diol bis(3-mercaptoisobutyrate), octane diol bis(3-mercaptoisobutyrate), trimethylol propane tris(3-mercaptoisobutyrate), pentaerythritol tetrakis(3-mercaptoisobutyrate), dipentaerythritol hexakis(3-mercaptoisobutyrate), ethylene glycol bis(2-mercaptoisobutyrate), propylene glycol bis(2-mercaptoisobutyrate), diethylene glycol bis(2-mercaptoisobutyrate), butane diol bis(2-mercaptoisobutyrate), octane diol bis(2-mercaptoisobutyrate), trimethylol propane tris(2-mercaptoisobutyrate), pentaerythritol tetrakis(2-mercaptoisobutyrate), dipentaerythritol hexakis(2-mercaptoisobutyrate), ethylene glycol bis(4-mercaptovalerate), propylene glycol bis(4-mercaptoisovalerate), diethylene glycol bis(4-mercaptovalerate), butane diol bis(4-mercaptovalerate), octane diol bis(4-mercaptovalerate), trimethylol propane tris (4-mercaptovalerate), pentaerythritol tetrakis(4-mercaptovalerate), dipentaerythritol hexakis(4-mercaptovalerate), ethylene glycol bis(3-mercaptovalerate), propylene glycol bis(3-mercaptovalerate), diethylene glycol bis(3-mercaptovalerate), butane diol bis(3-mercaptovalerate), octane diol bis(3-mercaptovalerate), trimethylol propane tris (3-mercaptovalerate), pentaerythritol tetrakis(3-mercaptovalerate), dipentaerythritol hexakis(3-mercaptovalerate), hydrogenated bisphenol A bis(3-mercaptobutyrate), bisphenol A dihydroxyethyl ether-3-mercaptobutyrate, 4,4'-(9-fluorenylidene)bis(2-phenoxyethyl(3-mercaptobutyrate)), ethylene glycol bis(3-mercapto-3-phenylpropionate), propylene glycol bis(3-mercapto-3-phenylpropionate), diethylene glycol bis(3-mercapto-3-phenylpropionate), butane diol bis(3-mercapto-3-phenylpropionate), octane diol bis(3-mercapto-3-phenylpropionate), trimethylol propane tris(3-mercapto-3-phenylpropionate), tris-2-(3-mercapto-3-phenylpropionate) ethyl isocyanurate, pentaerythritol tetrakis(3-mercapto-3-phenylpropionate), dipentaerythritol hexakis(3-mercapto-3-phenylpropionate).

Specific examples of particularly preferable polyfunctional thiol compounds include those represented by the following formulae (6) to (11) and (18) to (21):

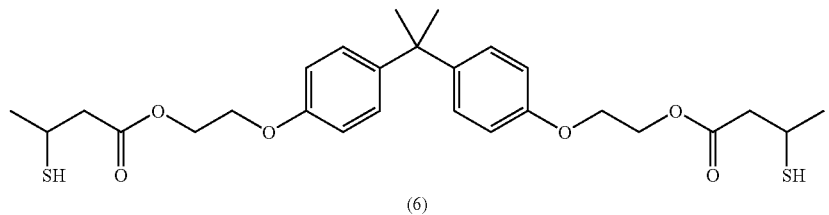

(6)

[Chem. 22]

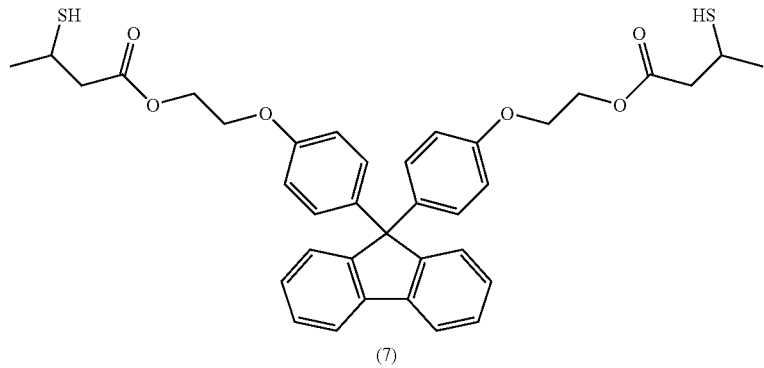

(7)

[Chem. 23]

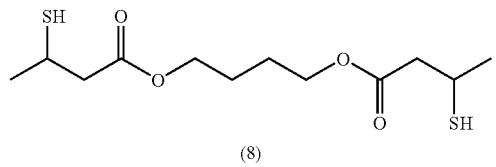

(8)

[Chem. 24]

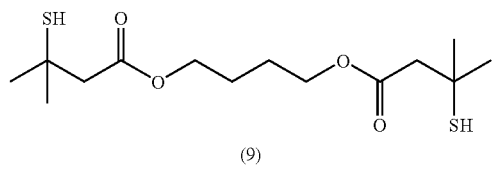

(9)

[Chem. 25]

[Chem. 26]
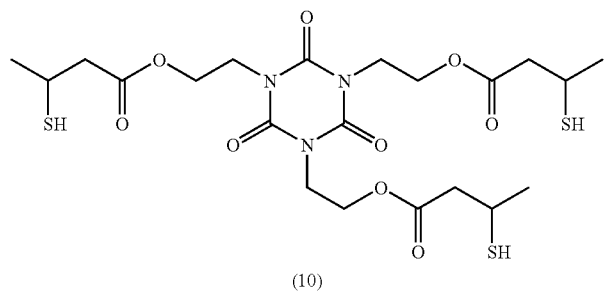
(10)
[Chem. 27]
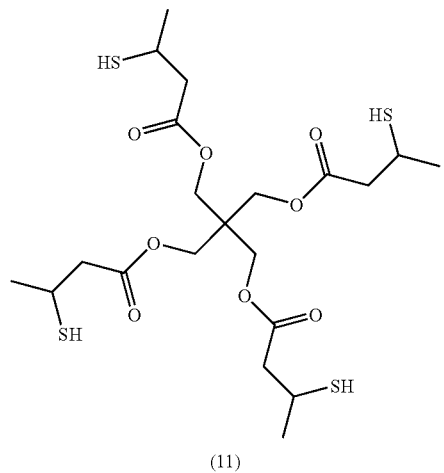
(11)
[Chem. 28]
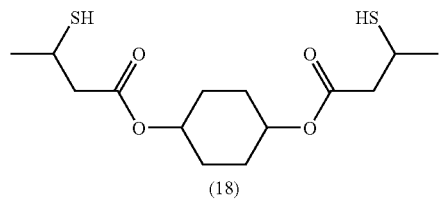
(18)
[Chem. 29]
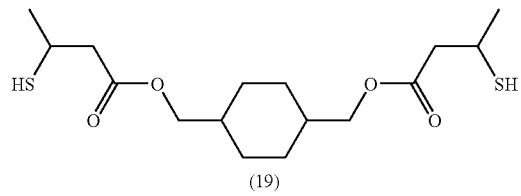
(19)
[Chem. 30]
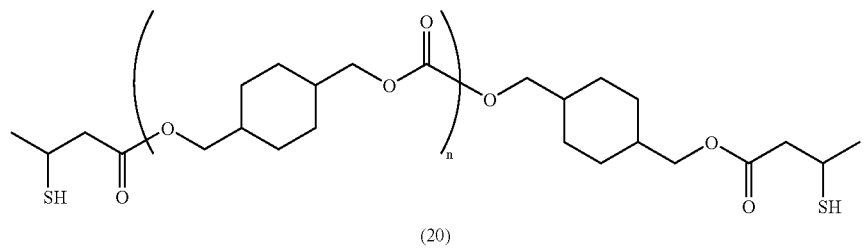
(20)
wherein n represents an integer of 1 to 10.

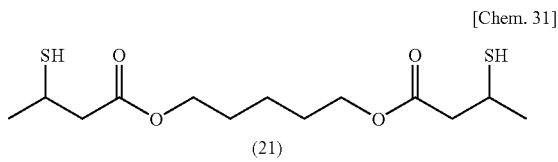

(21)

Examples of the thiol compound having an ether structure (c) include the one having an ether derivative structure represented by the above formula (17). Specific examples include a compound containing a structure such as 2-mercaptoethylether group, 2-mercaptopropylether group, 3-mercaptopropylether group, 2-mercaptobutylether group, 3-mercaptobutylether group, 4-mercaptobutylether group, 5-mercaptopentylether group and 5-mercaptohexylether group, but the present invention is not limited thereto.

The molecular weight of the thiol compound used in the present invention is not particularly limited, but preferably 200 to 2000.

The method for producing the thiol compound used in the present invention is not particularly limited. Ester of the mercapto group-containing carboxylic acid and alcohols can be obtained by generating ester of carboxylic acid containing a mercapto group represented by formula (3) and alcohols by conventional methods. There is not a particular limit on the conditions for esterification reaction, and the method can be appropriately selected from conventionally known reaction conditions.

Urethane Compound Containing an Ethylenically Unsaturated Double Bond

The urethane compound containing an ethylenically unsaturated double bond used in the present invention is a compound curable via radical polymerization (or crosslinking) reaction and addition reaction. These compounds can be used alone or in combination of two or more thereof.

The urethane compound containing an ethylenically unsaturated double bond used in the present invention is a specific urethane compound represented by formula (2) containing an ethylenically unsaturated double bond.

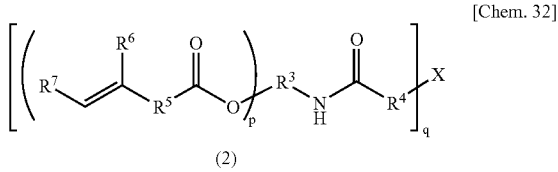

(2)

In the above-mentioned formula (2), $R^3$ represents a linear or branched alkylene group having 1 to 10 carbon atoms or an aromatic ring. As $R^3$, preferred are alkylene group such as methylene group, ethylene group, propylene group, butylene group, pentamethylene group, neopentyl group, hexamethylene group and octamethylene group; and an aromatic ring such as phenylene group, trilene group and xylylene group. Among these, ethylene group, butylene group, pentamethylene group, hexamethylene group or phenylene group is preferable.

$R^4$ represents an oxygen atom, sulfur atom or imino group, and preferably is an oxygen atom or sulfur atom.

$R^5$ represents a single bond or a linear or branched alkylene group having 1 to 5 carbon atoms, and preferably is a single bond.

$R^6$ represents a hydrogen atom or a methyl group.

$R^7$ represents at least one group selected from a group consisting of a hydrogen atom, a linear or branched alkyl group having 1 to 6 carbon atoms and aryl group. Examples of $R^7$ include a hydrogen atom; alkyl group such as methyl group and ethyl group; and aryl group such as phenyl group, tolyl group and naphthyl group. Among these, a hydrogen atom and phenyl group are preferable.

X represents a group selected from aliphatic group, aromatic group and heterocyclic group. Examples of X include polyol such as ethylene glycol, 1,3-propanediol, 1,4-butane diol, 1,6-hexane diol, trimethylol propane, pentaerythritol, norbornene dimethanol, norbornane dimethanol, polycarbonate diol, di-terminated hydroxyl polysilicon, 2,2-bis[4-(2-hydroxyethyloxy)phenyl]propane and tris(2-hydroxyethyl) isocyanurate; or a residue of an alcohol compound such as 2-hydroxy(meth)acrylate. Among these, a residue of 1,6-hexanediol, tris(2-hydroxyethyl)isocyanurate, 2,2-bis[4-(2-hydroxyethyloxy)phenyl]propane or 2-hydroxy(meth)acrylate is preferable.

p represents an integer of 1 to 3, and q represents an integer of 1 to 4.

Examples of the urethane compound represented by formula (2) containing an ethylenically unsaturated double bond include a compound represented by formula (12):

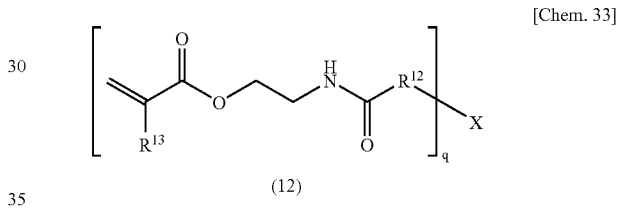

(12)

wherein $R^{12}$ represents an oxygen atom, sulfur atom or imino group; $R^{13}$ represents a hydrogen atom or methyl group; X represents a group selected from aliphatic group, aromatic group and heterocyclic group; and q represents an integer of 1 to 4; and a compound represented by formula (13):

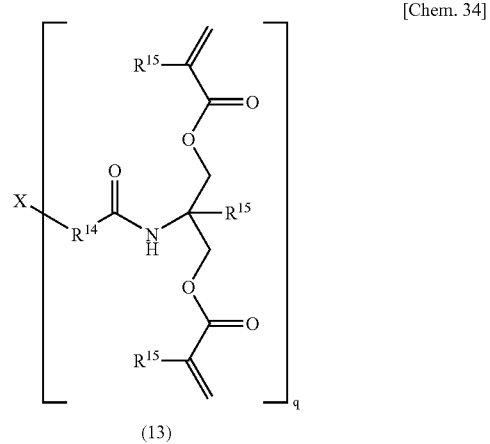

(13)

wherein $R^{14}$ represents an oxygen atom, sulfur atom or imino group; $R^{15}$ represents a hydrogen atom or methyl group; X represents a group selected from aliphatic group, aromatic group and heterocyclic group; and q represents an integer of 1 to 4; and a compound represented by formula (14):

[Chem. 35]

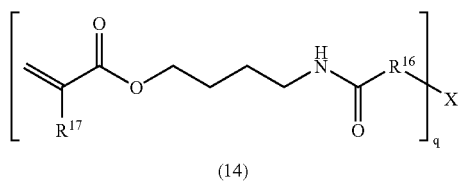

(14)

wherein $R^{16}$ represents an oxygen atom, sulfur atom or imino group; $R^{17}$ represents a hydrogen atom or methyl group; X represents a group selected from aliphatic group, aromatic group and heterocyclic group; and q represents an integer of 1 to 4; and a compound represented by formula (15):

[Chem. 36]

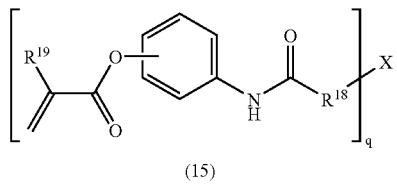

(15)

wherein $R^{18}$ represents an oxygen atom, sulfur atom or imino group; $R^{19}$ represents a hydrogen atom or methyl group; X represents a group selected from aliphatic group, aromatic group and heterocyclic group; and q represents an integer of 1 to 4.

The urethane bond in the present invention include a thiouretane bond when $R^4$ in formula (2), $R^{12}$ in formula (12), $R^{14}$ in formula (13), $R^{16}$ in formula (14) and $R^{18}$ in formula (15) are a sulfur atom; and a urea bond when these R's are imino group.

Examples of the urethane compound represented by formula (2) containing an ethylenically unsaturated double bond is a compound in which 2-(meth)acryloyloxyethyl isocyanate, 2,2-bis(acryloyloxymethyl)ethyl isocyanate, 1,1-bis (acryloyloxymethyl)methyl isocyanate, 4-(meth)acryloyloxyphenyl isocyanate, 4-(meth)acryloyloxybutyl isocyanate, 3-(meth)acryloyloxyphenyl isocianate and the like are added to activated hydrogen such as alcohol. Examples thereof include a compound in which an isocyanate compound as mentioned above is added to a polyol compound such as ethylene glycol, 1,3-propanediol, 1,4-butanediol, 1,6-hexanediol, trimethylol propane, pentaerythritol, norbornene dimethanol, norbornane dimethanol, polycarbonate diol, diterminated hydroxyl polysilicon, 2,2-bis[4-(2-hydroxyethyloxy)phenyl]propane or an alcohol compound such as 2-hydroxyethyl(meth)acrylate. These compounds can be used alone or in combination of two or more thereof.

The urethane equivalent of the urethane compound containing an ethylenically unsaturated double bond used in the present invention is 10 to 40%, preferably 12 to 35%. The urethane equivalent less than 10% may lower the reactivity and fails to attain sufficient curing. Meanwhile, when the equivalent exceeds 40%, urethane bond in excess may lower the handling ability and reactivity due to increase in viscosity. A curable composition using a urethane compound containing an ethylenically unsaturated double bond wherein urethane equivalent is set within the above-mentioned optimum range is enhanced in heat resistance and hardness as well as adhesiveness and reactivity. The urethane equivalent in the present invention indicates a value obtained by the following formula:

[(molecular weight of urethane bond (—OCONH—))*/(molecular weight of urethane (meth)acrylate]×100(%)

* molecular weight of urethane bond (—OCONH—): 59.02

With respect to the composition ratio of the above-mentioned thiol compound and the urethane compound containing an ethylenically unsaturated double bond, the mercapto group of the thiol compound to ethylenically unsaturated double bond is preferably 1:99 to 50:50 in molar ratio, more preferably in the range of 5:95 to 20:80 in molar ratio.

Polymerization Initiator

A polymerization initiator may be added to the curable composition of the present composition and, for example, a photo or thermal polymerization initiator can be used. In the present invention, a photo polymerization initiator is preferable.

The photo polymerization initiator is activated via irradiation of active energy line such as ultra-violet or visible light and electron beam, and the resin component reacted with the activated polymerization initiator induces a chain reaction of polymerization and radical addition to thereby obtain a cured product.

Specific examples of such a photo polymerization initiator include 1-hydroxycyclohexyl phenylketone, 2,2'-dimethoxy-2-phenylacetophenone, xanthone, fluorene, fluorenone, benzaldehyde, anthraquinone, triphenylamine, carbazole, 3-methylacetophenone, 4-chlorobenzophenone, 4,4'-dimethoxybenzophenone, 4,4'-diaminobenzophenone, Michler's ketone, benzoylpropylether, benzoineethylether, benzyldimethylketal, 1-(4-isopropylphenyl)-2-hydroxy-2-methylpropane-1-one, 2-hydroxy-2-methyl-1-phenylpropane-1-one, thioxanthone, diethylthioxanthone, 2-isopropylthioxanthone, 2-chlorothioxanthone, 2-methyl-1-[4-(methylthio)phenyl]-2-morpholinopropane-1-one, 2,4,6-trimethylbenzoyldiphenyl phosphine oxide, 2-benzyl-2-dimethylamino-1-(4-morpholinophenyl)butane-1-one and 1-[4-(2-hydroxyethoxy)phenyl]-2-hydroxy-2-methylpropane-1-one. They may be used alone or in combination of two or more thereof. Among these, use of 2,4,6-trimethylbenzoyldiphenyl phosphine oxide or 1-hydroxycyclohexyl phenylketone is particularly preferable.

Polymerization reaction can also be induced by heat to obtain a cured product. That is, a curable composition can be made by adding a thermal polymerization initiator. However, in some cases addition reaction can be initiated without the presence of a thermal polymerization initiator.

As such a thermal polymerization initiator, an azo compound such as azobisdiphenylmethane, 2,2'-azobisisobutyronitrile and dimethyl-2,2'-azo bis(2-methylpropionate); organic peroxides such as diacyl peroxides, ketone peroxides, hydroperoxides, dialkylperoxides, peroxy esters; and persulfate can be used. They can be used alone or in combination of two or more thereof.

Specific examples of the organic peroxide include benzoyl peroxide, 3,5,5-trimethylhexanoyl peroxide, lauroyl peroxide, stearoyl peroxide, octanoyl peroxide, di-n-propylperoxy dicarbonate, diisopropylperoxy dicarbonate, bis(4-t-butylcyclohexyl)peroxy dicarbonate, di-2-ethoxyethylperoxy dicarbonate, di-2-ethylhexylperoxy dicarbonate, di-2-methoxybutylperoxy dicarbonate, di(3-methyl-3-methoxybutyl)peroxy dicarbonate, 1,1,3,3-tetramethylbutylperoxy neodecanoate, 1-cyclohexyl-1-methylethylperoxy neodecanoate, t-hexylperoxy neodecanoate, t-butylperoxy neodecanoate, t-hexylperoxy pivalate, t-butylperoxy pivalate, 1,1,3,3-tetramethylbutylperoxy-2-ethylhexanoate, 1-cyclohexyl-1-methylethylperoxy-2-ethylhexanoate and t-hexylperoxy-2-ethylhexanoate.

Though there is not a particular limit on the used amount of a polymerization initiator, it is preferably in a range of 0.1 to 20, more preferably 0.5 to 10 parts by mass to 100 parts by mass of the urethane compound containing an ethylenically unsaturated double bond. It is because when the used amount of a polymerization initiator is less than 0.1 part by mass, it may slow the polymerization rate or tend to cause inhibition of polymerization due to oxygen and the like. Meanwhile, when the used amount of the polymerization initiator exceeds 20 parts by mass, it will intensify the termination reaction in polymerization reaction and adversely affect the obtainable degree of adhesion and transparency.

Also, additives including an adhesion improver such as a silane coupling agent and acid phosphate ester, antioxidant, hardener, dye, filler, pigment, thixotropic agent, plasticizer, surfactant, lubricant and antistatic agent may be added to the curable composition of the present invention as needed.

Curable Composition

The curable composition of the present invention can be dispensed and prepared as follows:

The curable composition can be dispensed and prepared by mixing the thiol compound and the urethane compound containing an ethylenically unsaturated double bond to be used in the present invention and a polymerization initiator as needed by mixing equipment such as a mixer, ball mill or three-roll mill at room temperature or on heating; or by adding a solvent and the like as a diluent and dissolving the mixture.

Examples of the thiol compound and the urethane compound containing an ethylenically unsaturated double bond are those mentioned above, and examples of a solvent include esters such as ethyl acetate, butyl acetate, isopropyl acetate; ketones such as acetone, methylethyl ketone, methylisobutyl ketone and cyclohexanone; cyclic ethers such as tetrahydrofurane and dioxane; amide such as N,N-dimethylformamide; aromatic hydrocarbons such as toluene; and halogenated hydrocarbons such as methylene chloride.

There is not a particular limit on the method for curing the above-mentioned curable composition. The composition can be cured, for example, by applying the above-mentioned cured composition on a substrate to form a coating and then by sending radiation thereto, by heating the coated substrate or by combining the irradiation and heating.

The thickness of the coating is preferably within a range of 1 to 200 μm for evaluation, but can be adjusted appropriately depending on the intended use.

Examples of the method for applying the composition include applying by use of a dye coater, spin coater, spray coater, curtain coater and roll coater; applying by screen printing; and applying by a dipping method.

The radiation ray to be used is not particularly limited, and preferably is an electron beam, or a light source in a region extending from the ultraviolet to the infrared of the spectrum. For example, one can use an ultrahigh pressure mercury lamp or a metal halide lamp for an ultraviolet ray, a metal halide lamp or a halogen lamp for a visible ray, and a halogen lamp for an infrared ray. Besides, a laser beam and an LED lamp can be used as well. Use of an infrared ray also enables thermal curing. The irradiance level can be adjusted depending on the kind of the light source, the coating thickness and the like.

EXAMPLES

The present invention is described in further detail in reference to examples and comparative examples, but should not be construed as being limited thereto.

Examples 1 to 24 and Comparative Examples 1 to 6

[1] Preparation of a Curable Composition and Evaluation Samples

Each of the thiol compound (TH-1 to TH-13) in Table 1, the urethane compound containing an ethylenically unsaturated double bond (monomer compound, M-1 to M-12) in Table 2 and 1-hydroxy-cyclohexyl-phenyl-ketone (produced by Ciba Specialty Chemicals, Irgacure184) as a polymerization initiator in the blending quantity defined in Table 3 were mixed and stirred with 20 g of dichloromethane (produced by Junsei Chemical Co., Ltd.) and uniformly dissolved to obtain a solution of a curable composition.

Further, the obtained composition solutions were applied onto a glass substrate (50 millimeters square) so as to make the dried film about 200 μm thick. The solvent was dried in vacuum at 50° C. for 30 minutes thereby to obtain evaluation samples in Examples 1 to 24 and Comparative Examples 1 to 6.

The urethane compounds containing an ethylenically unsaturated double bond in Table 2 used in Comparative Examples, M-11 and M-12, are the following (meth)acryl group-containing polymers:

M-11: A methacryl group-containing copolymer having a urethane bond obtained by reacting pendant hydroxyl groups of "P-1" (a copolymer of butyl methacrylate and 2-hydroxyethylacrylate at the molar compounding ratio of 4 to 1; polystyrene reduced number-average molecular weight (Mn)=14,000, polystyrene reduced weight-average molecular weight (Mw)=25,000) with 2-methacryloyloxyethyl isocyanate. That is, M-11 is a copolymer having repeating units represented by (A-1) and (A-2) in Table 2 and the component ratio of the repeating units is 4 to 1.

M-12: An acryl group-containing copolymer having a urethane bond obtained by reacting pendant hydroxyl groups of the above-mentioned P-1 with 2-acryloyloxyethyl isocyanate. That is, M-12 is a copolymer having repeating units represented by (A-1) and (A-3) in Table 2 and the component ratio of the repeating units is 4 to 1.

The above molecular weight Mn and Mw were derived from the GPC molecular weight obtained by GPC measurement. The measurement was made under the following conditions:

Measuring equipment: C-R7A Plus Chromatopac, manufactured by Shimadzu Corporation;

Precolumn: SHODEX GPC KF-G, manufactured by Showa Denko K. K.;

Columns: SHODEX GPC KF-8025×1, SHODEX GPC KF-802×1 and SHODEX GPC K-801×1; all manufactured by Showa Denko K. K.;

Column temperature: 40° C.;

Developing solvent: THF; and

Flow rate: 1 mL/min.

TABLE 1

TABLE 1-continued
TH-10
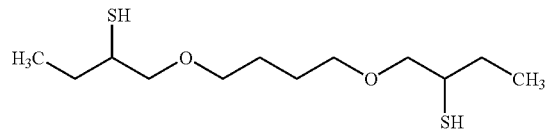
TH-11
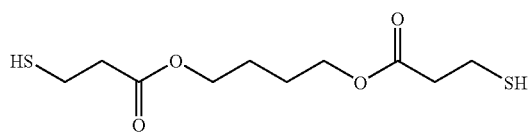
TH-12
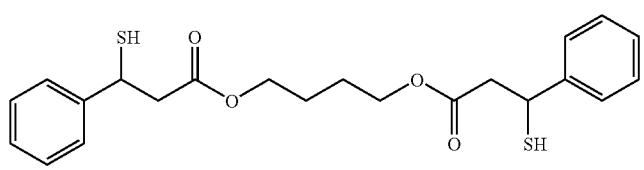
TH-13
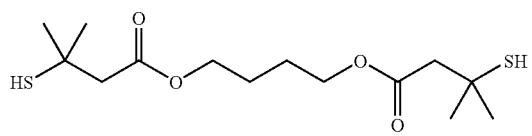
TABLE 2
M-1
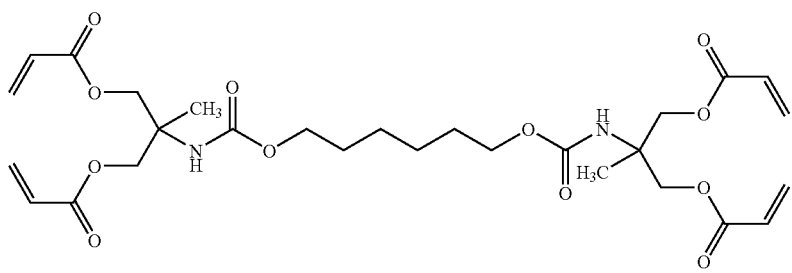
M-2
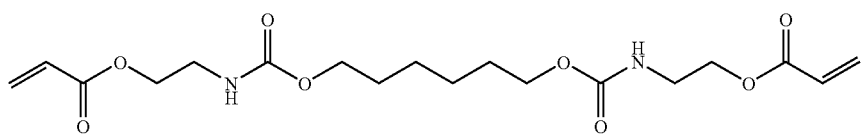
M-3
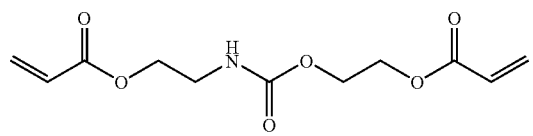
M-4
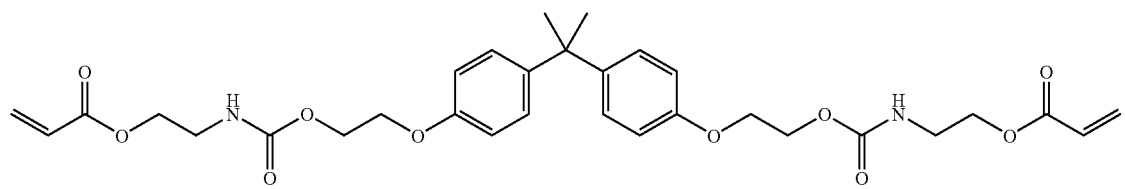

TABLE 2-continued
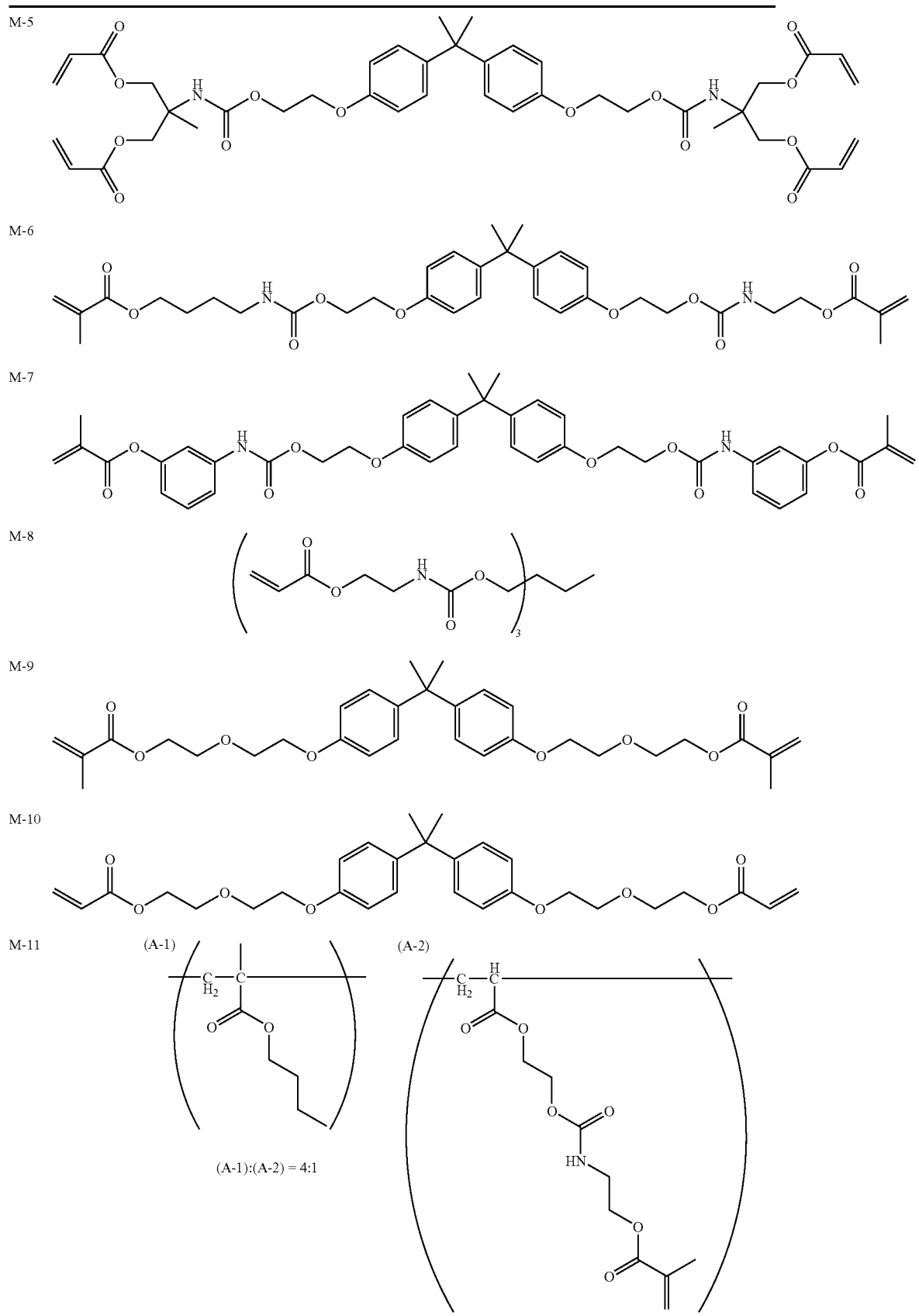

TABLE 2-continued

M-12

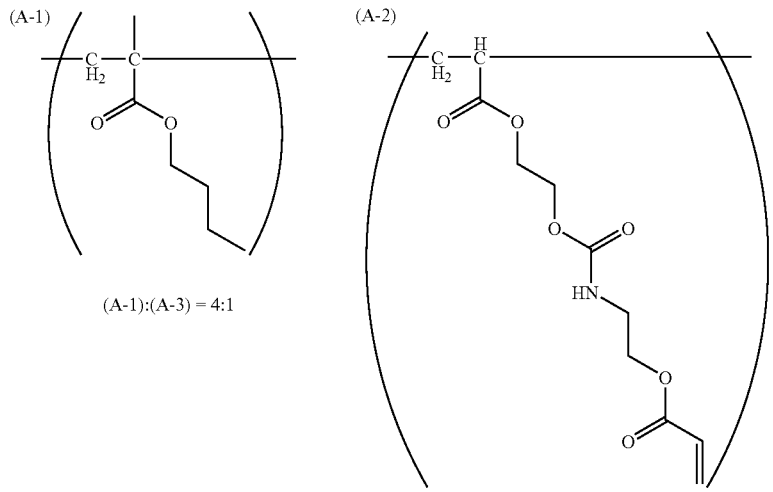

(A-1):(A-3) = 4:1

[2] Evaluation of the Curable Composition (1) Determination of Reactive Property The absorption peak of the ethylenically unsaturated double bond group of the evaluation samples prepared in above [1] measured using an infrared spectrometer (produced by JASCO Corporation; FT/IR7000) was 810 cm$^{-1}$. The samples were exposed to the light using an exposure system incorporating an ultrahigh pressure mercury lamp (produced by USHIO Inc.; Multilight ML-251A/B) with the exposure amount required for a steady-state reaction (500 mj/cm$^2$). The reaction rate of the ethylenically unsaturated double bond group was determined from the amount of change in the absorption beak of the ethylenically unsaturated double bond group:

(intensity absorption peak after the exposure/intensity absorption peak before the exposure)×100(%)

The results are shown in Table 3.

(2) Measurement of Adhesive Degree

The samples made in the above [1] were exposed to the light using an exposure unit incorporating an ultrahigh pressure mercury lamp with the exposure amount of 3 j/cm$^2$. The surface of the cured film of each of the cured sample was polished with a sandpaper to measure the adhesion degree using an adhesion tester (produced by Elcometer Instruments Ltd.; elcometor). The results are shown in Table 3.

(3) Measurement of the Light Transmission

The evaluation samples made in the above [1] were exposed to the light using an exposure unit incorporating an ultrahigh pressure mercury lamp with the exposure amount of 3 j/cm$^2$. The light transmission at 500 nm of each of the cured samples was measured using a spectral photometer (produced by JASCO Corporation; 3100). The results are shown in Table 3.

(4) Measurement of Pencil Hardness

The evaluation samples made in the above [1] were exposed to the light using an exposure unit incorporating an ultrahigh pressure mercury lamp with the exposure amount of 3 j/cm$^2$. The cured product was measured under the following conditions.

The results are shown in Table 3.

Measurement equipment: Pencil Hardness Tester (manufactured by Ueshima Seisakusho Co., Ltd.)

Load: 1 kg

Pencil: a pencil for measuring pencil hardness, manufactured by Mitsubishi Pencil Co., Ltd.

Judgment: The existence of scratches was judged by visible observation. Among the pencils that hardly scratch the cured product, the hardness of the hardest pencil was considered to be the hardness of the sample.

(5) Measurement of the Glass Transition Point (Tg)

The evaluation samples made in the above [1] were exposed to the light using an exposure unit incorporating an ultrahigh pressure mercury lamp with the exposure amount of 3 j/cm$^2$. The obtained cured product was measured using a differential scanning calorimeter (DSC). The results are shown in Table 3.

The measurement conditions are as follows:

Measuring equipment: Thermo plus DSC8230, manufactured by Rigaku Corporation

Heating start temperature: 25° C.

Heating rate: 10° C. per minute

TABLE 3

| | Thiol compound (g) | | Monomer (g) | | Polymeri-Zation initiator (g) | | Urethane equivalent of mono-mer (%) | Reactivity of double bond (%) | Adhesive intensity (N/mm$^2$) | Trans-mittance (%) | Pencil hard-ness | Tg (°C.) |
|---|---|---|---|---|---|---|---|---|---|---|---|---|
| Example 1 | TH-1 | 0.60 | M-3 | 10 | I184 | 0.2 | 23.0 | 85 | 1.7 | 98.7 | 3H | >400 |
| 2 | TH-1 | 0.26 | M-4 | 10 | I184 | 0.2 | 19.8 | 78 | 2.7 | 98.7 | H | >400 |
| 3 | TH-1 | 0.26 | M-5 | 10 | I184 | 0.2 | 14.9 | 82 | 2.5 | 98.7 | 3H | >400 |
| 4 | TH-1 | 0.39 | M-6 | 10 | I184 | 0.2 | 17.3 | 69 | 1.7 | 98.6 | — | — |
| 5 | TH-1 | 0.21 | M-7 | 10 | I184 | 0.2 | 16.4 | 60 | 3.5 | 98.4 | — | — |
| 6 | TH-1 | 0.42 | M-8 | 10 | I184 | 0.2 | 29.6 | 71 | 1.6 | 98.9 | — | — |
| 7 | TH-2 | 0.54 | M-1 | 10 | I184 | 0.3 | 19.8 | 77 | 0.8 | 99.2 | — | — |
| 8 | TH-2 | 0.43 | M-2 | 10 | I184 | 0.4 | 29.5 | 90 | 1.3 | 99.3 | — | — |
| 9 | TH-11 | 0.25 | M-4 | 10 | I184 | 0.2 | 19.8 | 83 | 1.5 | 98.3 | — | — |
| 10 | TH-12 | 0.39 | M-4 | 10 | I184 | 0.2 | 19.8 | 80 | 2.1 | 98.4 | — | — |
| 11 | TH-13 | 0.27 | M-4 | 10 | I184 | 0.2 | 19.8 | 82 | 2.3 | 98.9 | — | — |
| 12 | TH-2 | 0.28 | M-4 | 10 | I184 | 0.2 | 19.8 | 82 | 2.6 | 98.8 | — | — |
| 13 | TH-3 | 0.27 | M-4 | 10 | I184 | 0.2 | 19.8 | 89 | 2.0 | 99.2 | — | — |
| 14 | TH-4 | 0.48 | M-4 | 10 | I184 | 0.2 | 19.8 | 80 | 2.2 | 98.8 | — | — |
| 15 | TH-5 | 0.59 | M-4 | 10 | I184 | 0.2 | 19.8 | 73 | 2.2 | 98.6 | — | — |
| 16 | TH-6 | 0.27 | M-4 | 10 | I184 | 0.2 | 19.8 | 72 | 1.7 | 98.7 | — | — |
| 17 | TH-7 | 0.27 | M-4 | 10 | I184 | 0.2 | 19.8 | 97 | 2.5 | 99.3 | — | — |
| 18 | TH-8 | 0.35 | M-4 | 10 | I184 | 0.2 | 19.8 | 86 | 2.3 | 99.0 | — | — |
| 19 | TH-9 | 0.33 | M-4 | 10 | I184 | 0.2 | 19.8 | 81 | 1.7 | 99.0 | — | — |
| 20 | TH-10 | 0.25 | M-4 | 10 | I184 | 0.2 | 19.8 | 88 | 2.0 | 99.0 | — | — |
| 21 | TH-1 | 0.14 | M-4 | 10 | I184 | 0.2 | 19.8 | 72 | 1.6 | 98.8 | — | — |
| 22 | TH-1 | 0.55 | M-4 | 10 | I184 | 0.2 | 19.8 | 88 | 2.7 | 99.1 | — | — |
| 23 | TH-1 | 0.27 | M-4 | 10 | I184 | 0.1 | 19.8 | 75 | 1.9 | 99.0 | — | — |
| 24 | TH-1 | 0.27 | M-4 | 10 | I184 | 0.5 | 19.8 | 81 | 2.0 | 98.4 | — | — |
| Comparative Example 1 | TH-1 | 0.20 | M-9 | 10 | I184 | 0.2 | — | 66 | 1.2 | 98.0 | — | — |
| 2 | TH-1 | 0.20 | M-10 | 10 | I184 | 0.2 | — | 56 | 1.0 | 98.1 | — | — |
| 3 | — | | M-4 | 10 | I184 | 0.2 | 19.8 | 68 | 1.8 | 96.9 | — | — |
| 4 | — | | M-5 | 10 | I184 | 0.2 | 14.9 | 70 | 1.8 | 97.1 | — | — |
| 5 | TH-1 | 0.20 | M-11 | 10 | I184 | 0.2 | 7.0 | 40 | — | — | HB | 300 |
| 6 | TH-1 | 0.20 | M-12 | 10 | I184 | 0.2 | 7.1 | 45 | — | — | HB | 290 |

Reactivity of double bond: Change of infrared absorption peak intensity (after the exposure/before the exposure)×100 (%)

Adhesive intensity: Adhesive intensity to a glass substrate

Transmittance: Transmittance at 500 nm

Table 3 shows measured values of the reactivity, adhesive degree, light transmission, pencil hardness and glass transition point (Tg) of the cured product obtained by reacting a urethane compound containing an ethylenically unsaturated double bond (monomer compound) with a thiol compound.

According to the results of measurement shown in Table 3, comparison of Examples 1 to 8 and Comparative Examples 1, 2, 5 and 6 shows that the composition of the present invention provides excellent reactivity of double bond. This is presumed to be attributed the phenomenon that a radical is propagated by hydrogen abstraction along with the chain transfer of the thiol group and that the active proton in the urethane bond of the urethane compound containing an ethylenically unsaturated double bond of the present invention contributes to polymerization. Also, comparison of Examples 9 to 20 and Comparative Examples 3 and 4 apparently shows that the thiol compound of the present invention contributes to improvement of the reactivity of double bond.

With respect to the adhesion degree, comparison of Examples 2 to 3 and Comparative Examples 3 to 4 apparently shows that addition of the thiol compound of the present invention contributes to improvement of the adhesion degree. It is attributed to the addition reaction concurrently caused with the radical polymerization reaction by the thiol group.

With respect to the light transmission, comparison of Examples 2 to 3 and Comparative Examples 3 to 4 shows that addition of the thiol compound of the present invention contributes to improvement of the light transmission. It is attributed to a mechanism that the progress of the addition reaction as well as the radical polymerization slows the polymerization degree, which makes the generated cured product more amorphous and reduces the crystallized region of the product.

Moreover, Comparative Examples 5 and 6 show that the curable composition using a urethane compound having insufficient urethane equivalent is inferior in reactivity of double bond. Furthermore, comparison of Comparative Examples 5 and 6 with Examples 1 to 3 shows that such a composition is also inferior in pencil hardness and glass transition point (Tg) (heat resistance).

Subsequently, the curable composition comprising a urethane compound containing an ethylenically unsaturated double bond and a thiol compound of the present invention is excellent in reactivity of double bond, adhesion degree and light transmission, and provides a cured product having excellent pencil hardness and heat resistance performance by optimizing the urethane equivalent value.

The invention claimed is:

1. A curable composition comprising a thiol compound containing two or more groups represented by formula (1):

[Chem. 1]

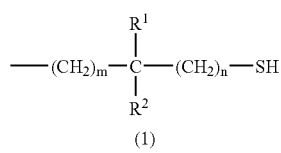

(1)

wherein $R^1$ and $R^2$ independently represent a hydrogen atom, an alkyl group having 1 to 10 carbon atoms or an aromatic ring; m represents 0 or an integer of 1 to 2; n represents 0 or 1; and a urethane compound containing an ethylenically unsaturated double bond represented by formula (13):

[Chem. 13]

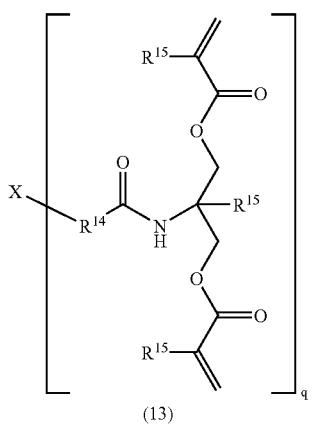

(13)

wherein $R^{14}$ represents an oxygen atom, a sulfur atom or an imino group; $R^{15}$ represents a hydrogen atom or a methyl group; and (i) X represents a group selected from an aliphatic group, an aromatic group, and a heterocyclic ring, and q represents an integer of 2 to 4; or (ii) X represents an alcohol residue of 2-hydroxyethyl(meth)acrylate and q represents 1 and/or formula (15):

[Chem. 15]

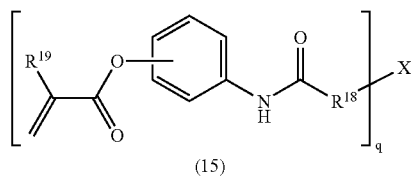

(15)

wherein $R^{18}$ represents an oxygen atom, a sulfur atom or an imino group; $R^{19}$ represents a hydrogen atom or a methyl group; and (i) X represents a group selected from an aliphatic group, an aromatic group, and a heterocyclic ring, and q represents an integer of 2 to 4; or (ii) X represents an alcohol residue of 2-hydroxyethyl(meth)acrylate and q represents 1.

2. The curable composition as claimed in claim 1, wherein the urethane equivalent of the urethane compound having an ethylenically unsaturated double bond represented by formula (2) is 10 to 40%.

3. The curable composition as claimed in claim 1, wherein the thiol compound is an ester compound of (A) a mercapto group-containing carboxylic acid represented by formula (3):

[Chem. 3]

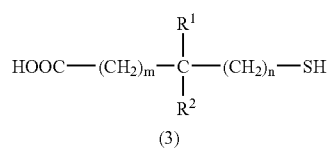

(3)

wherein the symbols in the formula have the same meanings as described in claim 1; and (B) a polyfunctional alcohol.

4. The curable composition as claimed in claim 1, wherein at least one of $R^1$ and $R^2$ of the thiol compound described in 1 above represents an alkyl group having 1 to 10 carbon atoms and the other represents a hydrogen atom.

5. The curable composition as claimed in claim 3, wherein the polyfunctional alcohol is a compound selected from alkylene glycol comprising an alkylene group having 2 to 10 carbon atoms which may be branched, diethylene glycol, dipropylene glycol, glycerin, trimethylolpropane, pentaerythritol, dipentaerythritol, cyclohexane diol, cyclohexane dimethanol, norbornene dimethanol, 2,2-bis[4-(2-hydroxyethyloxy)phenyl]propane, hydrogenated bisphenol A, 4,4'-(9-fluolenylidene) bis(2-phenoxyethanol) and tris-2-hydroxyethyl isocyanurate.

6. The curable composition as claimed in claim 3, wherein the thiol compound is a compound represented by formula (4):

[Chem. 4]

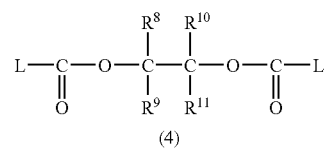

(4)

wherein $R^8$ to $R^{11}$ independently represent a hydrogen atom or an alkyl group having 1 to 10 carbon atoms; and L represents a group represented by formula (1):

[Chem. 1]

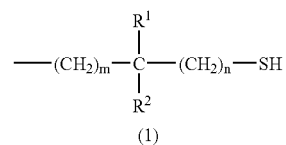

(1)

wherein $R^1$ and $R^2$ independently represent a hydrogen atom, an alkyl group having 1 to 10 carbon atoms or an aromatic ring; m represents 0 or an integer of 1 to 2; n represents 0 or 1.

7. The curable composition as claimed in claim 3, wherein the thiol compound is a compound represented by formula (5):

[Chem. 5]

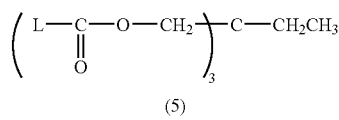

(5)

wherein L represents a group represented by formula (1):

[Chem. 1]

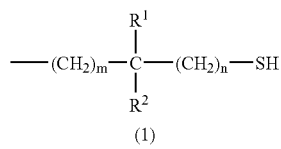

wherein $R^1$ and $R^2$ independently represent a hydrogen atom, an alkyl group having 1 to 10 carbon atoms or an aromatic ring; m represents 0 or an integer of 1 to 2; n represents 0 or 1.

8. The curable composition as claimed in claim 3, wherein the thiol compound is a compound represented by formula (6):

[Chem. 6]

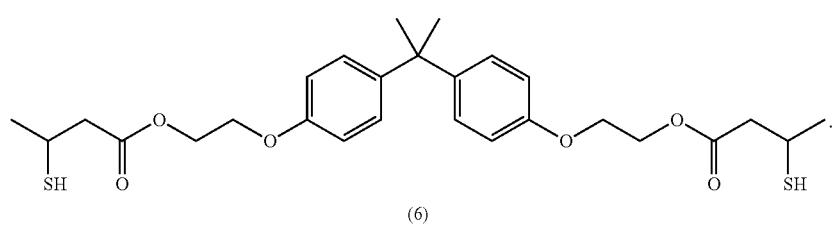

9. The curable composition as claimed in claim 3, wherein the thiol compound is a compound represented by formula (7):

[Chem. 7]

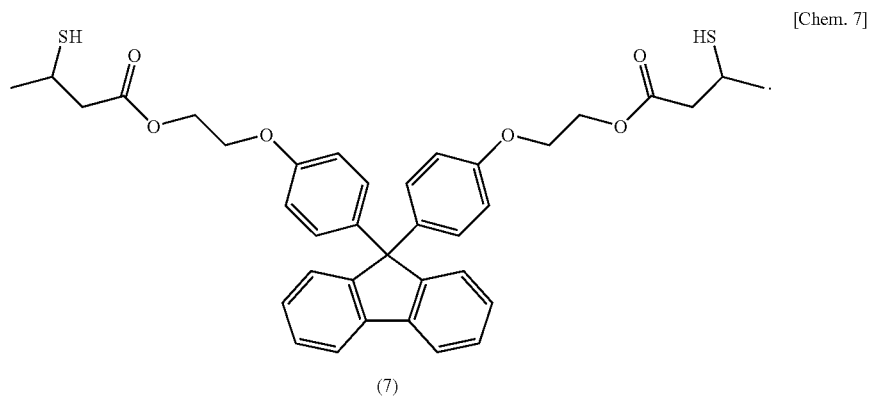

10. The curable composition as claimed in claim 3, wherein the thiol compound is a compound represented by formula (8):

[Chem. 8]

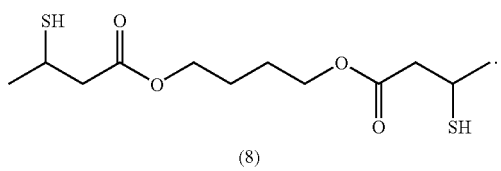

11. The curable composition as claimed in claim 3, wherein the thiol compound is a compound represented by formula (9):

[Chem. 9]

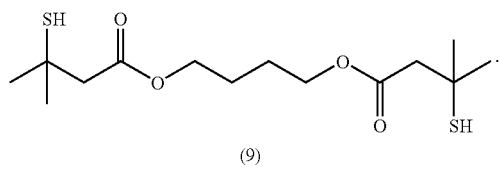

12. The curable composition as claimed in claim 3, wherein the thiol compound is a compound represented by formula (10):

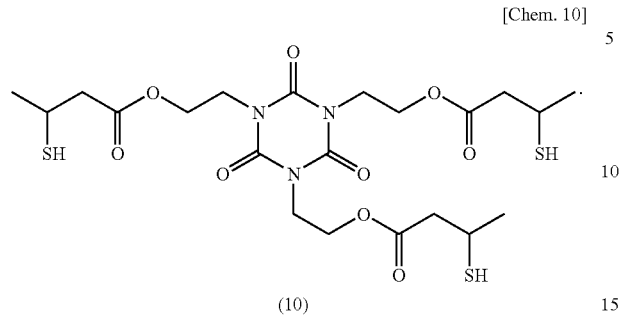

(10)

13. The curable composition as claimed in claim 3, wherein the thiol compound is a compound represented by formula (11):

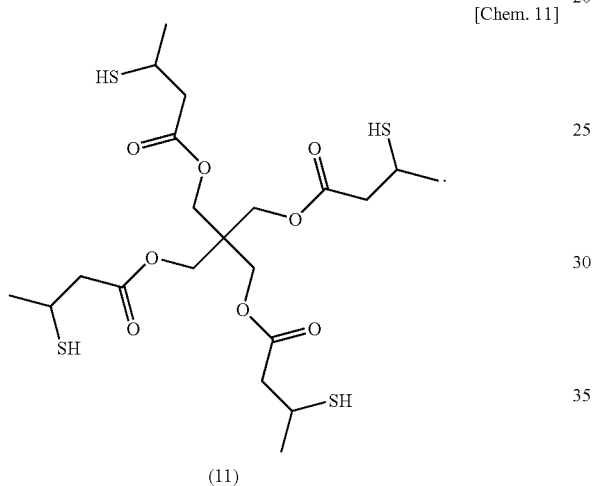

(11)

14. The curable composition as claimed in claim 1, comprising a photopolymerization initiator as well as a thiol compound and a urethane compound having an ethylenically unsaturated double bond.

15. A cured product obtained from the composition claimed in claim 1.

16. The curable composition as claimed in claim 1, wherein the urethane compound having an ethylenically unsaturated double bond is a compound represented by formula (13):

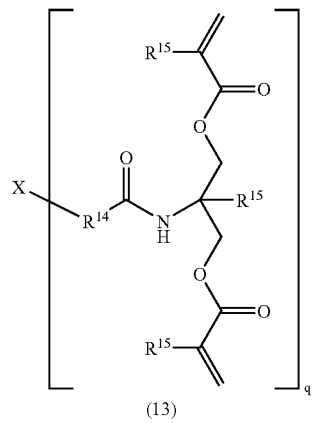

(13)

wherein $R^{14}$ represents an oxygen atom, a sulfur atom or an imino group; $R^{15}$ represents a hydrogen atom or a methyl group; and (i) X represents a group selected from an aliphatic group, an aromatic group and a heterocyclic ring, and q represents an integer of 2 to 4; or (ii) X represents an alcohol residue of 2-hydroxyethyl(meth)acrylate and q represents 1.

17. The curable composition as claimed in claim 1, wherein the urethane compound having an ethylenically unsaturated double bond is a compound represented by formula (15):

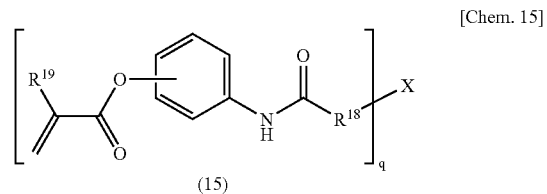

(15)

wherein $R^{18}$ represents an oxygen atom, a sulfur atom or an imino group; $R^{19}$ represents a hydrogen atom or a methyl group; and (i) X represents a group selected from an aliphatic group, an aromatic group and a heterocyclic ring, and q represents an integer of 2 to 4; or (ii) X represents an alcohol residue of 2-hydroxyethyl(meth)acrylate and q represents 1.

\* \* \* \* \*